United States Patent [19]

Kawai

[11] Patent Number: 4,696,006
[45] Date of Patent: Sep. 22, 1987

[54] METHOD OF GENERATING TEST PATTERNS FOR LOGIC NETWORK DEVICES

[75] Inventor: Masato Kawai, Tokyo, Japan
[73] Assignee: NEC Corporation, Tokyo, Japan
[21] Appl. No.: 802,114
[22] Filed: Nov. 25, 1985

[30] Foreign Application Priority Data

Nov. 26, 1984 [JP] Japan ................................ 59-248244

[51] Int. Cl.$^4$ ............................................. G01R 31/28
[52] U.S. Cl. ........................................ 371/27; 371/20; 371/25; 324/73 R
[58] Field of Search ....................... 371/27, 25, 15, 20; 324/73 R, 73 AT

[56] References Cited

U.S. PATENT DOCUMENTS

| | | | |
|---|---|---|---|
| 4,204,633 | 5/1980 | Goel | 371/27 |
| 4,216,539 | 8/1980 | Raymond | 371/20 |
| 4,236,246 | 11/1980 | Skilling | 371/25 |
| 4,493,077 | 1/1985 | Agrawal | 371/25 |
| 4,503,386 | 3/1985 | DasGupta | 371/27 |
| 4,519,078 | 5/1985 | Komonytsky | 371/27 |
| 4,534,028 | 8/1985 | Trischler | 371/25 |
| 4,594,711 | 6/1986 | Thatte | 371/25 |

OTHER PUBLICATIONS

Prabhakar Goel, "An Implicit Enumeration Algorithm to Generate Tests for Combinational Logic Circuits", vol. C-30, No. 3, 3/81.
Satish M. Thatte & Jacob A. Abraham, "User Testing of Microprocessors", 1979.
Kideo Fujiwara & Takeshi Shimono, "On The Acceleration of Test Generation Algorithms", vol. C-32, No. 12, 12-83.
Melvin A. Brener & Arthur D. Friedman, "Test Generation for Sequential Circuits", Published in Computer Science, 1976.
H, Paul Roth, "Diagnosis of Automata Failures: A Calculus and a Method", Jul. 1966.
M. Kawai, H. Shibano, S. Funatsu, S. Kato, T. Kurobe, K. Ookawa & T. Sasaki, "A High Level Test Pattern Generation Algorithm", 1983.

Primary Examiner—Michael R. Fleming
Attorney, Agent, or Firm—Sughrue, Mion, Zinn, Macpeak and Seas

[57] ABSTRACT

Nodes and paths for connecting the nodes are used to form a model of at least one logic network. Next, all paths for connecting nodes in the logic network are traced, and the nodes and connecting path segments are sensitized and justified. The sensitizing patterns, when generating test patterns for a sequential circuit wherein the output is a function of a time sequence of inputs, may include a time sequence of sensitizing or input patterns for testing a single path through the network.

13 Claims, 13 Drawing Figures

METHOD OF GENERATING TEST PATTERNS FOR LOGIC NETWORK DEVICES

BACKGROUND OF THE INVENTION

The present invention relates to a method of generating test patterns for logic network devices which are used in computers, communication systems and other electrical equipment.

There are three conventional methods of generating test patterns for logic circuits. In the first method, a logic circuit is described as a pattern of gates, and an algorithm such as the D algorithm, PODEM or FAN, etc., can be applied to the pattern of gates. For details of the D algorithm, reference may be made to an article by J. Paul Roth, entitled "Diagnosis of Automata Failures: A Calculus and a Method", IBM Journal of Research and Development, Vol. 10, pp. 278-291, July 1966. For details of the PODEM algorithm, reference may be made to an article by Prabhakar Goel, entitled "An Implicit Enumeration Algorithm to Generate Tests for Combinational Logic Circuits", IEEE TRANSACTIONS ON COMPUTERS, Vol. C-30, No. 3, pp. 215-222, March 1981. For details of the FAN algorithm, reference may be made to an article by Hideo Fujiwara et al, entitled "On the Acceleration of Test Generation Algorithms", IEEE TRANSACTIONS ON COMPUTERS, Vol. C-32, No. 12, pp. 1137-1144 December 1983.

The first method is essentially suitable for combinational networks, but is inefficient for use with sequential circuits. The use of the D-algorithm in testing sequential circuits has been discussed, e.g., by M. Breuer and A. Friedman in *Diagnosis & Reliable Design of Digital Systems,* published by Computer Science Press, Inc., 1976, pp. 90-100, but this has not proven entirely satisfactory. Furthermore, it is difficult to apply the method to large scale circuits because the method is based on a gate model.

In the second method, the subject circuits are functionally described, and the test patterns that show how to change each function in response to the failure are generated. For details of the second method, reference may be made to an article by Satish M. Thatte et al, entitled "User Testing Of Microprocessors", IEEE PROC. COMPCON Spring pp. 108-114, 1979.

It is difficult for the second method to reflect differences in circuit structure in the fault model, because there is no information about the structure of the circuit. Furthermore, it is difficult to apply the second method to a random logic circuit which is not functionally closed.

To solve these problems of the second method, the third method incorporates circuit structure information into the functional circuit model, and the test patterns are generated to activate each signal line in the circuit. For details of the third method, reference may be made to an article by M. Kawai et al, entitled "A High Level Test Pattern Generation Algorithm", IEEE Proc. Test Conf. pp. 346-352, 1983. This method is essentially intended for combinational networks and it cannot be used effectively for sequential circuits. More particularly, in a true combinational network the output at an observable node will immediately reflect the input at a controllable node, and testing can be accomplished by applying an input and immediately examining the output. In a sequential network, however, the signals are propagated through the network over a plurality of clock cycles before being reflected at the observable node. It is therefore not possible to merely provide an input signal or signals and examine the output at that time.

SUMMARY OF THE INVENTION

An object of the present invention is therefore to provide a method of easily generating test patterns for large scale circuits, including sequential circuits.

According to the present invention, there is provided a method of generating a test pattern for at least one logic network, which network comprises an operator node, a controllable node, an observable node, and path segments or branches for connecting the nodes. At first, the paths from the observable node to the controllable node through the operator node are traced. Next, signals are generated to sensitize node on the paths traced. Then, the lines realizing the sensitized pathes are justified.

A significant improvement provided by the present invention is that, whereas the P-algorithm technique described in the Kawai et al paper is applicable only to combinational circuits wherein the output at an observable node is a function of the current inputs at the controllable nodes, the present invention defines its input patterns as time sequences of patterns when necessary for the testing of sequential circuits wherein the output at the observable node is a function of a sequence of input test patterns.

BRIEF DESCRIPTION OF THE DRAWINGS

The present invention will be described in greater detail with reference to the accompanying drawings, wherein:

FIG. 6 shows a flowchart of the operation of the present invention during the justification step of FIG. 1.

DETAILED DESCRIPTION OF THE INVENTION

As will become clear from the description which follows, the method of the present invention may be used in conjunction with a network model embodied by hardware as well as a network model graphically described and embodied by software.

Figure 1:
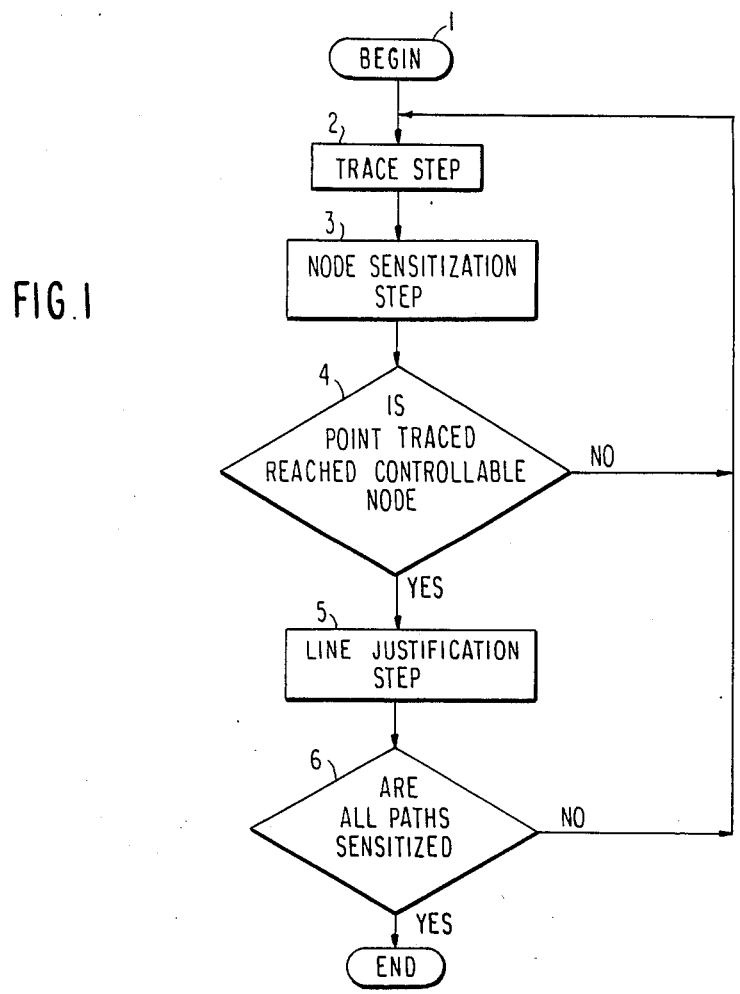
FIG. 1 shows an embodiment of the present invention.

The overall operation of the test pattern generation technique of the present invention is illustrated in the flowchart of FIG. 1, and it is largely similar to the P-algorithm technique described in detail in the above-cited paper by Kawai et al. To the extent necessary for a proper understanding of the invention, the above-cited papers are incorporated herein by reference.

As in the P-algorithm technique, the present invention selects an observable node and then sensitizes a path from the observable node back to a controllable node. This is continued until all path segments in the network have been sensitized at least once, and all unjustified signals are solved in a line justification step. At this point, the process of FIG. 1 is complete, although it should be noted that it will generally be desirable to perform a pattern compaction step as is done in the previously disclosed P-algorithm. A critical advantage of the method of the present invention, however, is its provision of time-serial test patterns for testing a single path, when necessary in the testing of a sequential circuit, as will be described in more detail below.

Figure 2C:
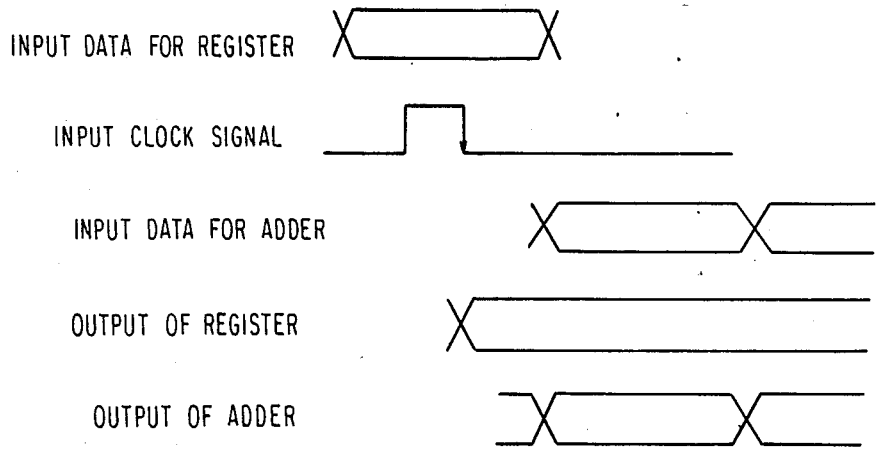
FIG. 2C shows a timing chart for describing a testing operation on the models shown in FIGS. 2A and 2B.
Figure 2A:
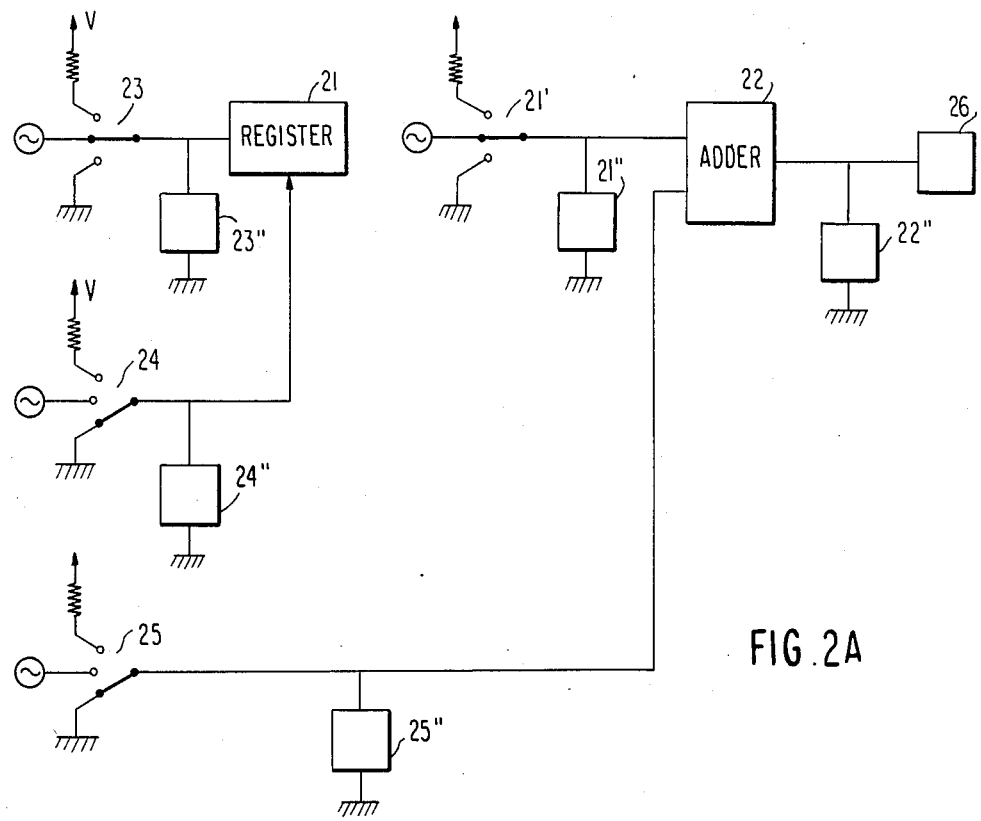
FIG. 2A shows hardware model which can be tested by the method according to the present invention.

The operation of the invention will first be described with reference to the flowchart of FIG. 1 as well as the diagrams of FIGS. 2A through 2C. It should be noted that the illustrations of FIGS. 2A and 2B are not diagrams of the actual circuits being tested but are instead conceptual diagrams for explaining the operation of the invention, e.g., FIG. 2A is a representation of how the pattern generating process of the present invention may view the hardware circuit for which the test patterns are being generated.

Referring to FIGS. 1, and 2A to 2C, in the start step of the present invention, the model information is entered into the computer. For the model shown in FIG. 2A, the model information comprises information about an N bit register 21 for storing N bit data in response to a clock signal, a controllable node 23 for supplying N bit data to the register 21, a controllable node 24 for supplying a clock signal to the register 21, an N bit adder 22 for adding the output of the register 21 to the input from a controllable node 25, and an observable node 26 for observing the output of the N bit adder 22. Since the network under test could use either single-bit or multi-bit data, for purposes of simplifying the following description the operation will be described hereinafter in the context of single-bit signaling.

Each of the controllable nodes 23, 24 and 25 and a register node 21', which must be updated each clock period, have three selectable inputs by which one of the "1", "0", and AC values may be selected. Each path segment connecting one node to another node is provided with a respective luminous diode 21" to 24", each of which has three functions. More particularly, when the signal on a path segment is "1", the corresponding diode is continuously on; when the signal on the path segment is "0", the diode is continuously off; and when the signal on the path segment is "AC" the diode blinks on and off. In this model, an AC signal on a path segment may "sensitize" that path segment.

Figure 2B:
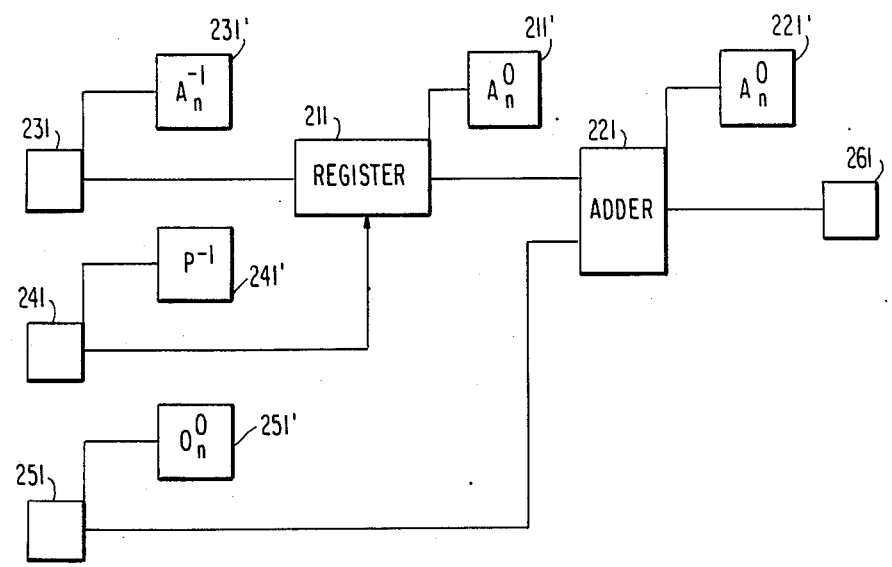
FIG. 2B shows a software symbolic model which can be tested by the method according to the present invention.

Referring to FIG. 2B, the model information provided to the computer in the start portion of the process of FIG. 1 comprises information regarding the controllable nodes 231, 241 and 251, a register 211, an adder 221 and an observable node 261 for observing the output of the adder 221. In place of the luminous diodes 21" to 24" in the model of FIG. 2A, the model of FIG. 2B has memories 211', 221', 231', 241', and 251'.

Referring again to FIG. 1, in the tracing step 2 for the hardware model, one untested observable node can be selected. Next, the computer generates path information to trace from the observable node to a controllable node via untraced path segments in the network. If there are no untraced path segments available over some portion of the path between the selected observable and controllable nodes, traced path segments are used for tracing those path portions.

For example, the trace operation is performed to select untried paths from the observable node back to a controllable node. However, when the trace operation reaches a point from which connection to a controllable node can be made through a tried path, this tried path is selected for the testing of the presently selected untried path. Thus, in the trace step 1 of FIG. 1, the nodes and the path segments are sequentially traced from the observable node, e.g., an external output terminal or cascade-connected F/F's, to the controllable node, e.g., an external input terminal or cascade-connected F/F's. The path for tracing covers all of the path segments in the network, and after sensitizing each traced path segment, fan-in trace is continued from the traced path segment toward the selected controllable node.

The tracing operation for the hardware model of FIG. 2A is as follows.

At first, the tracing operation starts from the observable node 26, and then selects the path to the controllable node 23 through the adder 22 and register 21. Having selected this path, the path segment which is connected from the observable node 26 to the operator node (adder 22) is traced.

The tracing operation in the software model of FIG. 2B is as follows. At first, the tracing operation starts from the observable node 261, and then selects the path to the controllable node 231 through the adder 221 and the register 211. Next, having selected this path to be traced, the path segment from the observable node 261 to the adder 221 is first traced.

Referring again to FIG. 1, in the node sensitization step 3, input signals are generated so that data signal lines and control signal lines are sensitized on the path traced. The input signals may be single-bit or parallel multi-bit signals. Whether single-bit or parallel multi-bit, an important feature of the present invention is that the input pattern necessary to sensitize a path from an observable node back to a controllable node may take the form of a time-serial input, e.g., an n' bit input signal (n'≧1) may be supplied over m' time periods (m'>1) or clock periods. This will allow the system to sensitize an entire path from a controllable node to an observable node even in the case of a sequential circuit.

For example, sensitization of the path between observable node 26 and controllable node 23 requires sensitization of the nodes 22 and 21 as well as the path segments between the observable and controllable nodes. Sensitization refers to the setting up of the path segments and nodes such that the observable node will respond to the signal presented at the controllable node, as is well known and as is described in the above-cited Kawai et al paper. To sensitize the adder 22, some fixed value should be applied to all inputs of the adder other than the particular input in the traced path segment, and this fixed value is preferably a "0" so that the input to the adder from the sensitized path will be passed to the output. This will "sensitize" the adder 22 as well as the following path segment coupling the adder output to the observable node 26 by making those portions of the traced path sensitive to the signals received from their fan-in path.

To sensitize the register 21 (assuming that it is the data input line to the register which is part of the selected path to be traced), it is merely necessary to apply a clock pulse to the register, whereby the register output will reflect the register data input. It should be noted, however, that the clock signal timing must take into consideration the propagation of the signal along the traced path and the need for the propagated signal to be available at some specified time at a later point along the traced path. Thus, it will be necessary to apply the clock pulse to the register one cycle earlier than the time at which the register output is needed. Similarly, the data to be applied to the register on the sensitized path will have to be supplied early enough to be captured by the clock pulse, so that it will also have to be at least one cycle earlier than the desired availability time of the register output.

By way of further example, FIG. 7 illustrates the timing concerns which must be taken into account when testing sequential circuits. For the harware model arranged generally as shown in FIG. 7A, FIGS. 7B–7D show that the data INPUT1 will be combined with additional input data at the lower inputs to the combinational network to provide an output OUTPUT1. When the clock signal is provided, the flip-flop(s) change their states and provide a new set of lower inputs to the combinational network, so that a new output OUTPUT2 will be provided as soon as the data INPUT2 is available. Similarly, the data OUTPUT3 will be available when INPUT3 is first provided after the clocking of the flip-flop(s), and so forth. To properly test the circuit, therefore, it will be necessary to provide a sequence of input patterns, e.g. first setting or resetting the flip-flop(s), then providing INPUT1, a clock signal, INPUT2, etc.

Figure 8:
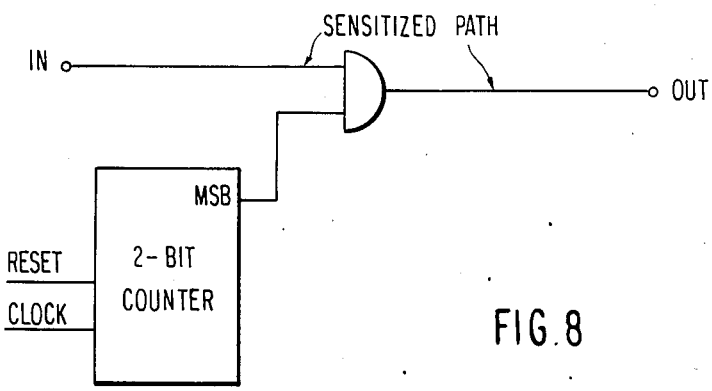

As a still further example, for the simple harware conceptually illustrated in FIG. 8, the sensitization of the path from IN to OUT requires the sensitization of the operator node represented by an AND gate, and this sensitization is accomplished by providing a "1" to the lower input of the gate. Since the sensitizing value is to be provided from a counter, however, the procedure may require the resetting of the counter at a time prior to the desired sensitization time such that the counter output terminal connected to the AND gate will have a high value at the desired sensitizing time. For example, a divide-by-four counter may have to be reset four clock periods prior to the desired sensitizing time so that the path will be sensitized when the activating input data is provided to the input terminal IN. Note that this may require that in some cases the sequential input patterns be provided over discontinuous time periods. That is, the first pattern for sensitizing a path may be provided during a first clock period, e.g., for resetting the counter, and the next pattern in the sequence may not be provided until, e.g., four clock periods later when the counter has reached an appropriate value.

The purpose of the diodes 21'', 22'' and 23'' is to indicate that these path segments have been sensitized during the trace. Ideally, an AC signal applied to controllable node 23 would propagate along the test path and intermittently illuminate all of the diodes. However, the register 21 will not pass an AC signal but will only assume an output value corresponding to the value of its input AC signal at the time of the clock pulse. Thus, during sensitization the switch 21' is used to couple an AC signal to the path between register 21 and adder 22 to intermittently illuminate the diode 21'' and indicate sensitization.

Figure 5:
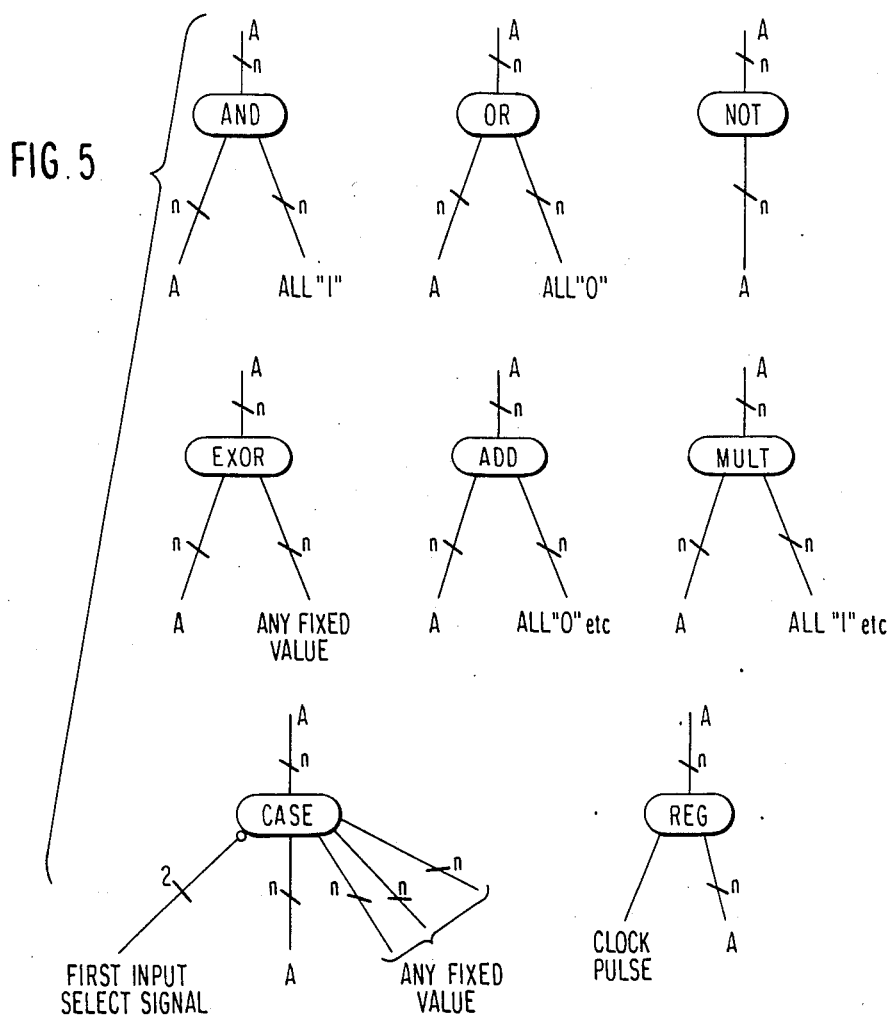
FIG. 5 shows examples of operator nodes characterized as combinations of operating functions, inputs and outputs.

The examples of input values for sensitizing paths through the operator node are shown in FIG. 5 and Table 1.

TABLE 1

| OPERATOR | INPUT VALUE ON THE SENSITIZING PATH | THE OTHER INPUT VALUE |
|---|---|---|
| N-bit AND | Activating value (SENSITIZING) | "1" N bit |
| N-bit OR | Activating value | "0" N bit |
| N-bit NOT | Activating value | — |
| N-bit EXOR | Activating value | Any Fixed Value |
| N-bit ADD | Activating value | "0" of N bit/"1" of N bit etc. |
| N-bit MULTIPLY | Activating value | "0" of N bit/"1" of N bit etc. |
| N-bit CASE (SELECTOR) | Activating value | When data input line is sensitized Data lines: Any Fixed Value Control lines: The vaLue for selection of sensitized path When control input line is sensitized Data lines: different predetermined value each other |
| N-bit IF | Activating value | The same value of the CASE of N bit item |
| N-bit REGISTER | Activating value | When data input line is sensitized Clock: Pulse When clock input line is sensitized Data: Any fixed value |

That is, the input values, for operator nodes with the functions of AND, OR, NOT, EXOR, ADD, MPY, CASE, IF and REG, to justify the lines are shown.

For example, in case of an AND operator, all 1's are needed as an input to the other input terminal of the operator node so that one input value is transmitted to the output of the operator node. If the AND operator comprises an N-bit AND operator wherein a plurality of AND gates each receive and combine respective bits of the two signals being ANDed, a "1" value must be provided to the "other" input of each of the N AND gates.

In case of a CASE operator, to sensitize a particular data input line, the input value for selecting the value on the particular data input line is applied to the control terminal of the operator node and any fixed values are supplied to the data input terminals other than the particular data input terminal of the operator node.

In case of a REG operator, i.e., a register, to sensitize the data input line, the data is clocked into and out of the operator node. If it is necessary to input a clock signal, the time for inputting data and clock signals is defined as the desired time minus one clock period, as discussed above. In other words, as can be seen from FIG. 2C, in order for the register output to be concurrent with the data input to the adder provided from the controllable node 25, the input data to the register and the clock signal to the register must be provided during the previous clock cycle.

In the hardware model of FIG. 2A, input information to sensitize the path from the register 21 to the observable node 26 will be used in the calculation at the operator node, i.e., the adder 22. For this adding operation, the value "0" is set in the controllable node 25.

In the software model of FIG. 2B, to set the N bit activating value $A_n{}^0$ to the adder 221 at the time 0, the N bit activating value $A_n{}^0$ must be loaded into the memory 211' at the time 0, and an N bit vector 0 must be loaded into the memory 251' at the time 0.

Referring again to FIG. 1, in the first judging step 4, it is judged whether the sensitization has reached the controllable node or not. If the sensitization has not reached the controllable node, the operation returns to the trace step 2. If the sensitization has reached the controllable node, the operation is advanced to the line justification step 5.

In the hardware model of FIG. 2A, since the adder 22 is not a controllable node but is an operator node, the operation returns to the trace step 2. In the trace step 2, the operation traces from the adder 22 to the register 21. In this register 21 the information for sensitizing is sent out in response to the clock signal. Since the register cannot pass an AC value but will only assume an output value representing the instantaneous state of its data input, as described above, the switch 21' is attached to the register 21. The AC signal is supplied to the switch 21' for showing the sensitization. Then, it is judged whether the register 21 is a controllable node or not in the first judging step 4. Since the register 21 is not a controllable node, the operation returns to the trace step 2.

The operation finally reaches the controllable node 23. There is no need to "sensitize" the controllable node itself, since this is the node that will be controlled in the test, so that the operation moves to the first judging step 4. In the step 4, it is determined that the sensitization has reached a controllable node. Since the sensitization has reached a controllable node, the operation advances to the line justification step 5.

In the software model of FIG. 2B, at first, it is judged whether the adder 221 is a controllable node or not. Since the adder 221 is not a controllable node, the operation traces to the next register 211 in the trace step 2. Next, the register 211 is sensitized. Since the data input line is to be sensitized in this example, the controllable node 231 is required to supply the sensitizing information one clock cycle ahead of the desired time. i.e., one clock cycle ahead of the time at which the output from the register 211 is needed. The controllable node 241 is also required to supply clock signals at an advanced time, as described above.

Next, since the register 211 is not a controllable node, the trace step is executed again, so that the controllable node 231 is selected, and it is judged whether the node 231 is a controllable node or not. Since the node 231 is a controllable node, the operation advances to the line justification step 5.

Referring again to FIG. 1, in the line justification step 5, the other value not justified in the input value for sensitization is justified by the same manner of matching as in the D-algorithm, with the differences being primarily in the ability of the D-algorithm to handle only a one bit signal, whereas the present method can handle a plurality of bits, and in the method by which the two techniques handle inconsistencies detected during the justification process.

Figure 6:
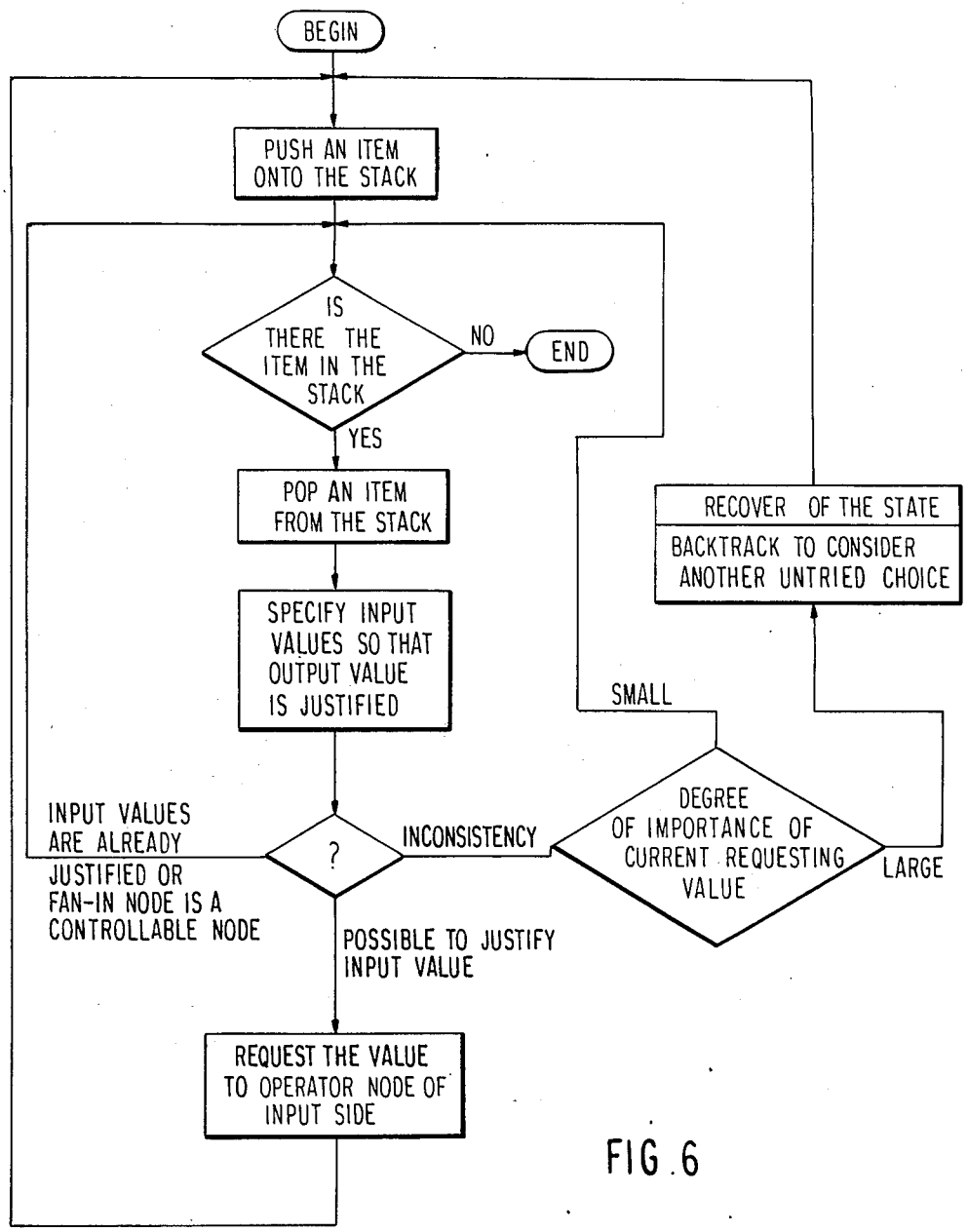
Figure 7A:
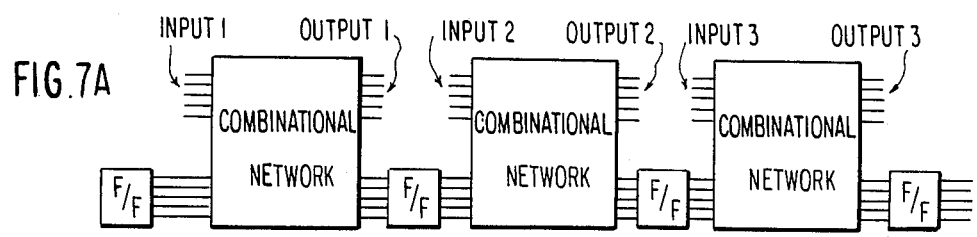
FIGS. 7A-7D and 8 are diagrams for explaining the sequential input patterns provided by the present invention.
Figure 7B:
Figure 7C:
Figure 7D:

The detailed operation can be seen with reference to FIG. 6. The operation of the D-algorithm is well understood in the art, and a detailed description of the steps followed in FIG. 6 is not necessary for a proper understanding of the invention. Briefly, the operation of the left-hand portion of the chart of FIG. 6 deals with the justification process when there are no detected inconsistencies, and this is the same as in the D-algorithm. The operation represented by the right-hand portion of the chart of FIG. 6 concerns the justification process when there are detected inconsistencies, and this is substantially the same as in the P-algorithm process described in the Kawai et al paper.

In the D-algorithm it is necessary to obtain entirely consistent signal values, whereas the present method is sufficient to justify the line enough so that, when the untried line is used as a path, the output value will be meaningful. For example, to sensitize an AND node in a circuit having N-bit parallel signaling, "1" bits are provided to one input of each of the AND gates. If the D-algorithm were used for a system with N-bit signaling, anything inconsistent with the N "1" bits would not be permitted. In the present invention, on the other hand, as described in the Kawai et al paper, it may be sufficient that at least one bit of the AND gate sensitizing input be satisfied, so that the desired output at the observable node will still be obtained. Further examples of the reconciling of inconsistent values, e.g., the priority of control lines over data lines and the selection of first-assigned values where two signals have the same priority, are described in the Kawai et al paper. An additional feature of the method of the present invention is the decision step in FIG. 6 where the importance of the present conflicting value is questioned before going to the trouble of performing the backtracing procedure discussed in more detail in the Kawai et al paper.

In the hardware model of FIG. 2A, "0" is provided as an input to the adder 22 from the controllable node 25 and the clock signal is provided as an input to the register 21 from the controllable node 24, for sensitization. In more detail, the activating value is first applied to the controllable node 23 and the clock signal is then provided to the controllable node 24. The sensitization of the register 21 is confirmed by the blink of the luminous diode 23". An activating value is provided as an input to the switch 21' and "0" is provided as an input to the controllable node 25. The sensitization of the path from the register 21 to the observable node 26 can be confirmed in the output of the adder 22, i.e., by the blink of the luminous diode 22".

All "0", All "1", random numbers, cyclic numbers generated from a number consisting of some "0" bits and a lot of the other "1" bits, and cyclic numbers generated from a number consisting of some "1" bits and a lot of other "0" bits can be used for sensitization input portions as a test pattern, and any values suitable for the condition of sensitization can be used for the other input portions.

In the software model of FIG. 2B, the nodes 241 and 251 are controllable nodes. Accordingly, since the condition in the judging step 4 is satisfied, line justification and final pattern generation are performed in step 5. In the software model, the same pattern in the hardware of FIG. 2A can be used as a test pattern.

This test pattern generated in the step 5, for testing a sequential circuit, includes $n''(n'' \geq 1)$ bits provided to appropriate controllable nodes over $m'(m' > 1)$ time periods, with the input condition of each node for sensitization being determined in the sensitization step 3. More particularly, when determining a sensitization pattern for testing a sequential circuit, the sensitization pattern will itself be sequential. At the sensitizing step 3, the system will determine the sequence of input patterns to the controllable nodes, while taking into consideration the timing requirements for signal propagation through the network, such that the desired output can be observed at the controllable node. The test pattern provided at the end of the process of FIG. 1 will then include a time sequence of patterns for testing any path through the network which may be a sequential circuit path, e.g., a signal path that may include one or more registers or flip-flops.

In the second judge step 6 of FIG. 1, the path segments sensitized are checked to determine whether the sensitized paths cover all the path segments in the network. If there is an untried path segment in the network detected at the judging step 6, the operation returns to the step 2, which executes the tracing of the untried path segment, and then justifies the lines by the same manner mentioned above. If all path segments in the network have been sensitized, the process is finished.

In the hardware model of FIG. 2A, for judging whether all path segments have been sensitized or not in the second judging step 6, the steps 2 and 3 are repeatedly executed. That is, the path from adder 22 to the controllable node 24 through the register 21 is selected and sensitized and then the path from the adder 22 to the controllable node 25 is selected and sensitized. The process of pattern generation is then finished.

In the software model of FIG. 2B, the same process of that of FIG. 2A is repeated and all paths are sensitized. After that, the process is finished.

Referring again to FIG. 1, in the second judge step 6, by repeatedly executing from the step 2 to the step 5, it can be determined whether the sensitization of the paths has covered all path segments in the network. If there is an untried path segment in the network, the operation returns to the step 2. If not, the operation is finished.

Figure 3:
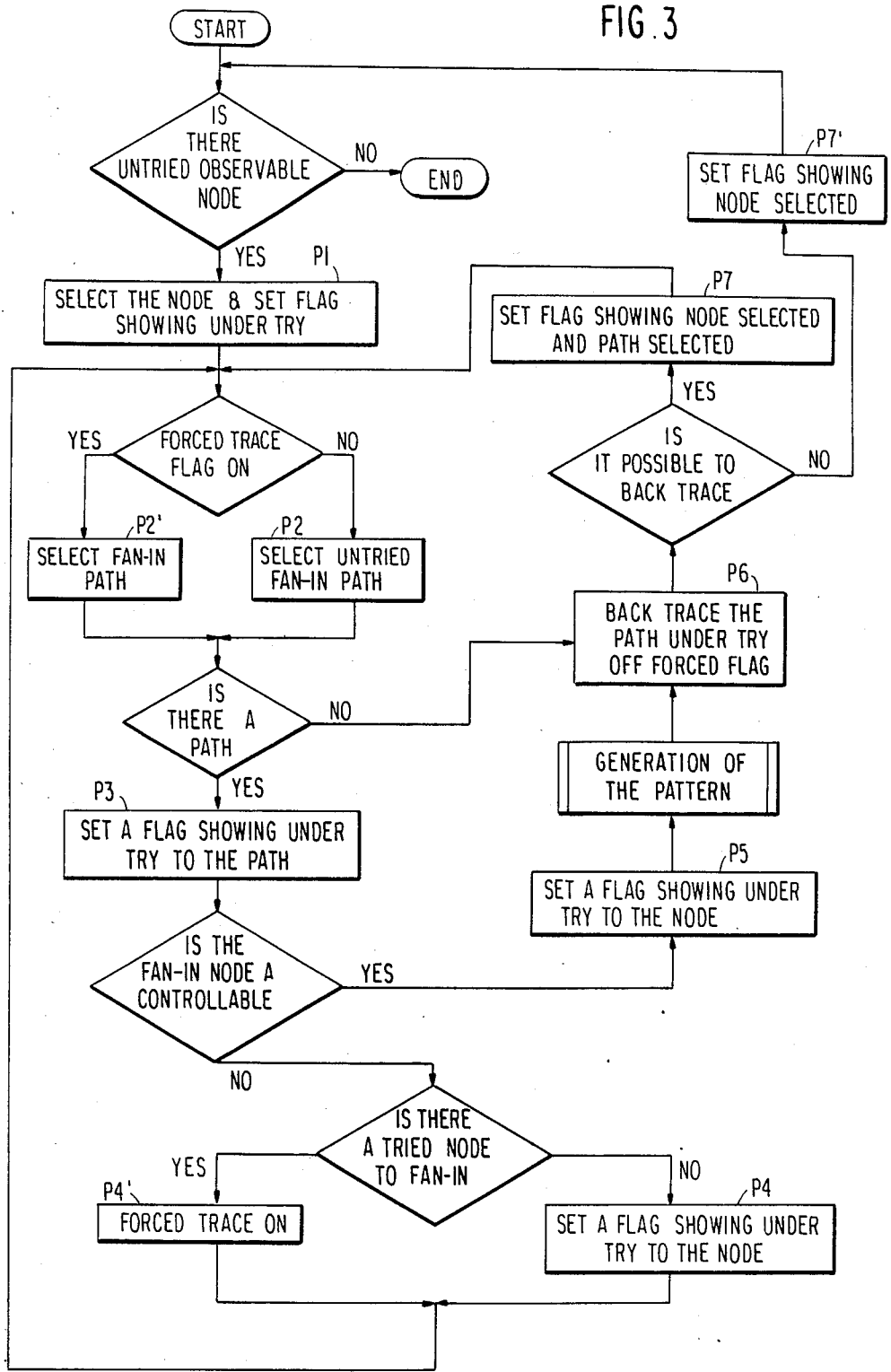
FIGS. 3 and 6 show a detailed flow chart of a part of the testing method of the present invention.

FIG. 3 shows a flow chart of a slightly different process from that of FIG. 1. The exact method of FIG. 3 is somewhat different from that of FIG. 1, e.g., with the method of FIG. 1 performing its node sensitization immediately prior to the judging step 4 and the method of FIG. 3 performing its node sensitization only after judging whether the node reached is a controllable node. Nevertheless, the methods are substantially similar and the operation of selecting path segments, as performed in the methods of both of FIGS. 1 and 3 and in the method described in the Kawai et al paper will be more clearly understood from the flowchart of FIG. 3. In the pattern generating portion of the method of FIG. 3, the function of the line justification step 5 in FIG. 1 is performed.

Figure 4:
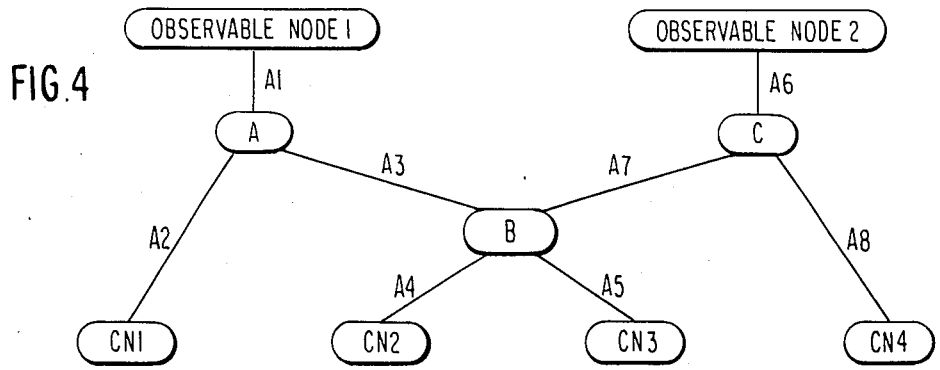
FIG. 4 shows a conceptual diagram of tracing paths in one example of a circuit to be tested according to the method of the present invention.

Referring to FIG. 4, a typical network under analysis may comprise observable nodes 1 and 2, operator nodes A, B and C, controllable nodes CN1 to CN4, and path segments A1 to A8 for connecting the nodes. The step-by-step operation of the procedure of FIG. 3 in the context of the network of FIG. 4 can be more clearly understood from the following table 2, where "U" indicates an untried state, "C" indicates that a node or path segment is currently being tried or tested, and "T" indicates that a particular node or path segment has been tested. The designations $P_1$-$P_7'$ correspond to processing steps $P_1$-$P_7'$ of FIG. 3. As can be seen from table 2, the system begins with an untested observable node, e.g., Node 1, and traces backward to a controllable node, e.g., CN1. Having reached a controllable node, the system then generates an input and sensitization signal pattern which should result in a desired output at the observable node under consideration. This is performed in the pattern generating step of FIG. 3.

TABLE 2

| STEP | OBN 1 | OBN 2 | A | B | C | CN 1 | CN 2 | CN 3 | CN 4 | A 1 | A 2 | A 3 | A 4 | A 5 | A 6 | A 7 | A 8 | FORCE FLAG |
|---|---|---|---|---|---|---|---|---|---|---|---|---|---|---|---|---|---|---|
| START | U | U | U | U | U | U | U | U | U | U | U | U | U | U | U | U | U |  |
| P1 | C |  |  |  |  |  |  |  |  |  |  |  |  |  |  |  |  |  |
| P2,P3 |  |  |  |  |  | C |  |  |  |  |  |  |  |  |  |  |  |  |
| P4 |  |  | C |  |  |  |  |  |  |  |  |  |  |  |  |  |  |  |
| P2,P3 |  |  |  |  |  |  | C |  |  |  |  |  |  |  |  |  |  |  |
| P5 |  |  |  |  | C |  |  |  |  |  |  |  |  |  |  |  |  |  |
| P6,P7 |  |  |  |  |  | T | T |  |  |  |  |  |  |  |  |  |  |  |
| P2,P3 |  |  |  |  |  |  |  | C |  |  |  |  |  |  |  |  |  |  |
| P4 |  |  |  | C |  |  |  |  |  |  |  |  |  |  |  |  |  |  |
| P2,P3 |  |  |  |  |  |  |  |  | C |  |  |  |  |  |  |  |  |  |
| P5 |  |  |  |  |  | C |  |  |  |  |  |  |  |  |  |  |  |  |
| P6,P7 |  |  |  |  |  | T |  |  |  |  | T |  |  |  |  |  |  |  |
| P2,P3 |  |  |  |  |  |  | C |  |  |  |  |  |  |  |  |  |  |  |
| P5 |  |  |  |  |  |  |  | C |  |  |  |  |  |  |  |  |  |  |
| P6,07 |  |  |  |  |  |  | T |  |  |  |  | T |  |  |  |  |  |  |
| P2,P6,P7 |  |  |  | T |  |  |  |  |  |  | T |  |  |  |  |  |  |  |
| P2,P6,P7 |  |  | T |  |  |  |  |  |  |  |  |  |  |  |  |  |  |  |
| P2,P6,P7' | T |  |  |  |  |  |  |  |  |  |  |  |  |  |  |  |  |  |
| P1 |  | C |  |  |  |  |  |  |  |  |  |  |  |  |  |  |  |  |
| P2,P3 |  |  |  |  |  |  |  |  |  |  |  |  | C |  |  |  |  |  |
| P4 |  |  |  | C |  |  |  |  |  |  |  |  |  |  |  |  |  |  |
| P2,P3 |  |  |  |  |  |  |  |  |  |  |  |  |  | C |  |  |  |  |
| P4 |  |  |  |  |  |  |  |  |  |  |  |  |  |  |  |  |  | ON |
| P2',P3 |  |  |  |  |  |  |  |  |  |  |  |  | C |  |  |  |  |  |
| P5 |  |  |  |  |  | C |  |  |  |  |  |  |  |  |  |  |  |  |
| P6,P7 |  |  |  |  |  | T |  |  |  |  |  |  | T |  |  | T |  | OFF |
| P2,P6,P7 |  |  |  | (T) |  |  |  |  |  |  |  |  |  |  |  | T |  |  |
| P2,P3 |  |  |  |  |  |  |  |  |  |  |  |  |  | C |  |  |  |  |
| P5 |  |  |  |  |  |  |  | C |  |  |  |  |  |  |  |  |  |  |
| P6,P7 |  |  |  |  |  |  | T |  |  |  |  |  |  | T |  |  |  |  |
| P2,P6,P7' |  |  |  | T |  |  |  |  |  |  |  |  |  | T |  |  |  |  |
| P2,P6,P7' |  | T |  |  |  |  |  |  |  |  |  |  |  |  |  |  |  |  |
| END |  |  |  |  |  |  |  |  |  |  |  |  |  |  |  |  |  |  |

In table 2, it is seen that the system first tests the path including observable node 1, operator node A, controllable node CN1 and paths A1 and A2. After this test, the system traces back toward the observable node along the test path, entering a "T" flag for each path segment, until it finds an untried fan-in path. This occurs immediately at the node A where the untried fan-in path segment A3 is detected. Thus, at first the "T" designations are entered only for CN1 and path segment A2.

From node A, the path segments A3, node B and path segment A4 are selected and tested, followed by a trace back to node B at which untried path segment A5 is detected and "T" flags are entered for CN2 and path segment A4. After testing path segment A5, the system traces all the way back to observable node 1 without finding an untried fan-in path segment, and "T" flags are entered for path segments A5, A3 and A1, CN3, operator nodes A and B and observable node 1.

Observable node 2 is then selected, followed by path segment A6, operator node C and path segment A7. At this point, the system finds that there is an already tried node B connected to the last selected but as yet untried branch A7, and the path segment A4 (together with CN2 and operator node B) are selected. After testing this path, a "T" is entered for path segment A7 as well as again entered for CN2, segment A4 and operator node B, and the system then completes the test by selecting A8 and CN4. The "(T)" indication in Table 2 merely indicates that the operator node B is already set to the T value and need not be reset, whereas the node CN2 and path segment A4 had been reset to "C" and must now be changed to "T".

As can be seen from the above description, in this path selection operation, untried flags are set for all of the nodes and path segments. The untried flags are changed to "C" flags as the nodes and path segments are being selected during tracing, and when the trace operation is completed for all path segments which can share a particular path segment, a "T" flag is entered indicating the completion of testing of that particular segment.

The process according to the invention can be used not only with hardware and software models, but also firmware models. When the process according to the invention is executed, the process may be suspended during the course of the process of FIG. 1, and then may be resumed at the point suspended.

This invention provides a method to efficiently generate test patterns by modeling a circuit as a combination of nodes and paths and using the trace, sensitizing and justifying steps, while using a sequential pattern of inputs to sensitize any path which may include sequential circuit components.

What is claimed is:

1. A method of testing a network, said network comprising a controllable node responsive to a given input pattern, an operator node for performing a predetermined function for the input pattern, an observable node for observing an output of the operator node and signal path segments for connecting the nodes, said method including the steps of:
   tracing a path from said observable node to said controllable node through operator node;
   determining a sensitizing condition for sensitizing said traced path;
   generating an input pattern sequence for sensitizing said traced path, said input pattern sequence comprising at least first and second input patterns provided at different times;
   applying said generated patterns to said network; and
   examining outputs of said network to determine the existence of faults in said network.

2. A method according to claim 1, wherein said network includes means operable in response to a clock signal and said first and second input patterns are provided during first and second cycles of said clock signal with said second cycle being separated in time from said first cycle by at least one interventing clock pulse.

3. A method according to claim 1, wherein said network includes a plurality of controllable nodes, said method including tracing paths from said observable node to each of said controllable nodes until all possible paths between said observable and controllable nodes have been traced, and generating test patterns for each traced path.

4. A method according to claim 3, wherein for a traced path unaffected by sequential circuit components, said input information comprises a single input pattern, for a traced path including sequential circuit components, said input information comprises at least first and second input patterns provided at different times, and for a traced path which itself includes no sequential components but the sensitization of which requires the operation of a sequential circuit component, said input information comprises at least first and second input patterns provided at different times.

5. A method according to claim 3, wherein each input pattern comprises a plurality of bits.

6. A method according to claim 1, wherein said network includes a plurality of observable, operator and controllable nodes, and said tracing step comprises:
   A. tracing a path from an observable node to a controllable node;
   B. returning toward said observable node to the most recent previous operator node in said traced path and determining if any untraced paths exist between said previous operator node and any of said controllable nodes;
   C. if an untraced path exists between said previous operator node and a controllable node, tracing said untraced path;
   D. if no untraced path exists between said previous operator node and a controllable node, returning toward said observable node to the next most recent previous node in said path between said observable node and the last controllable node to which a path has been traced;
   E. repeating steps B–D until all paths from said observable node to any controllable nodes have been traced;
   F. selecting a further observable node; and
   G. repeating steps A–F until all paths in said network have been traced.

7. A method according to claim 1, wherein each input pattern comprises a plurality of bits.

8. A method of generating input patterns for testing a network, said network comprising a controllable node responsive to a given input pattern, an operator node for performing a predetermined function for the input pattern, an observable node for observing an output of the operator node and signal path segments for connecting the nodes, said method including the steps of:
   tracing a path from said observable node to said controllable node through said operator node;
   determining a sensitizing condition for sensitizing said traced path; and
   generating an input pattern sequence for sensitizing said traced path, said input pattern sequence comprising at least first and second input patterns provided at different times.

9. A method according to claim 8, wherein said network includes means operable in response to a clock signal and said first and second input patterns are provided during first and second cycles of said clock signal with said second cycle being separated in time from said first cycle by at least one intervening clock pulse.

10. A method according to claim 8, wherein said network includes a plurality of controllable nodes, said method including tracing paths from said observable node to each of said controllable nodes until all possible paths between said observable and controllable nodes have been traced, and generating test patterns for each traced path.

11. A method according to claim 10, wherein for a traced path unaffected by sequential circuit components, said input information comprises a single input pattern, for a traced path including sequential circuit components, said input information comprises at least first and second input patterns provided at different times, and for a traced path which itself includes no sequential components but the sensitization of which requires the operation of a sequential circuit component, said input information comprises at least first and second input patterns provided at different times.

12. A method according to claim 10 wherein said network includes a plurality of observable, operator and controllable nodes, and said tracing step comprises:
A. tracing a path from an observable node to a controllable node;
B. returning toward said observable node to the most recent previous operator node in said traced path and determining if any untraced paths exist between said previous operator node and any of said controllable nodes;
C. if an untraced path exists between said previous operator node and a controllable node, tracing said untraced path;
D. if no untraced path exists between said previous operator node and a controllable node, returning toward said observable node to the next most recent previous node in said path between said observable node and the last controllable node to which a path has been traced;
E. repeating steps B-D until all paths from said observable node to any controllable nodes have been traced;
F. selecting a further observable node; and
G. repeating steps A-F until all paths in said network have been traced.

13. A method according to claim 8, wherein each input pattern comprises a plurality of bits.

* * * * *

UNITED STATES PATENT AND TRADEMARK OFFICE
CERTIFICATE OF CORRECTION

PATENT NO. : 4,696,006

DATED : September 22, 1987

INVENTOR(S) : MASATO KAWAI, Tokyo, Japan

It is certified that error appears in the above-identified patent and that said Letters Patent is hereby corrected as shown below:

Column 6, line 23, change "vaLue" to --value--.

Column 11, line 68, after "said netword" delete ":" and insert --;--.

Claim 6, line 1, after "A method according to" change "Claim 1" to --Claim 3--.

Signed and Sealed this

Twenty-fourth Day of May, 1988

Attest:

DONALD J. QUIGG

*Attesting Officer*

*Commissioner of Patents and Trademarks*